(12) United States Patent
Takaara

(10) Patent No.: US 6,919,281 B2
(45) Date of Patent: Jul. 19, 2005

(54) METHOD OF MANUFACTURING SEMICONDUCTOR DEVICE USING FLEXIBLE TUBE

(75) Inventor: Eiji Takaara, Yamanasi (JP)

(73) Assignee: Oki Electric Industry Co., Ltd., Tokyo (JP)

(*) Notice: Subject to any disclaimer, the term of this patent is extended or adjusted under 35 U.S.C. 154(b) by 48 days.

(21) Appl. No.: 10/628,381

(22) Filed: Jul. 29, 2003

(65) Prior Publication Data
US 2004/0072449 A1 Apr. 15, 2004

(30) Foreign Application Priority Data

Jul. 30, 2002 (JP) ........................................ 2002-220557

(51) Int. Cl.⁷ .............................................. H01L 21/31
(52) U.S. Cl. ...................................... 438/758; 438/760
(58) Field of Search ................................ 438/758, 760; 138/121, 149

(56) References Cited

U.S. PATENT DOCUMENTS

| | | | |
|---|---|---|---|
| 3,028,289 A | 4/1962 | Roberts et al. | |
| 4,147,185 A | 4/1979 | Hines | |
| 5,279,333 A | 1/1994 | Lawrence | |
| 5,379,804 A | 1/1995 | Dunn et al. | |
| 5,380,050 A | 1/1995 | Sanders et al. | |
| 5,413,147 A | 5/1995 | Moreiras et al. | |
| 5,497,809 A | * 3/1996 | Wolf | ............. 138/113 |
| 5,520,223 A | * 5/1996 | Iorio et al. | ............. 138/140 |
| 5,678,610 A | 10/1997 | Scarazzo et al. | |
| 5,706,864 A | 1/1998 | Pfleger | |
| 5,848,618 A | 12/1998 | Guest | |
| 5,901,755 A | 5/1999 | Winter et al. | |
| 6,216,742 B1 | 4/2001 | Masui et al. | |
| 6,310,284 B1 | 10/2001 | Ikeda | |

FOREIGN PATENT DOCUMENTS

| | | |
|---|---|---|
| JP | 09-273696 | 10/1997 |
| JP | 10-238689 | 9/1998 |

* cited by examiner

Primary Examiner—Michael Lebentritt
Assistant Examiner—Olivia T. Luk
(74) Attorney, Agent, or Firm—Rabin & Berdo, P.C.

(57) ABSTRACT

In a method of manufacturing a semiconductor device, a flexible tube connects at least part of a path extending from a reaction chamber to a detoxification device through a vacuum pump. The flexible tube has a tube body made of hard material, the tube body having projected parts and depressed parts and a cover provided over an outer surface of the tube body, the cover being made of elastic material, the cover being in contact with around the projected parts of the tube body and formed over the depressed parts of the tube body so that a vacant space is formed between the tube body and the cover. Then, a semiconductor substrate is disposed within the reaction chamber. The vacuum pump is activated to bring the reaction chamber into a pressure-reduced state. A reaction gas is supplied to the reaction chamber. Finally, the reaction gas causes to react to thereby deposit a reactant on the semiconductor substrate.

30 Claims, 12 Drawing Sheets

METHOD OF MANUFACTURING SEMICONDUCTOR DEVICE USING FLEXIBLE TUBE

BACKGROUND OF THE INVENTION

The present invention relates to a method of manufacturing a semiconductor device, using a flexible tube, and specifically to a method of using a flexible tube in a semiconductor manufacturing apparatus and manufacturing a semiconductor device by the semiconductor manufacturing apparatus.

A number of chemical materials are used in the manufacture of a semiconductor device. In particular, the semiconductor device undergoes many manufacturing processes associated with chemical reactions. Since the chemical reactions are generally performed under pressure and temperature conditions different from normal ones, they are carried out within a reaction chamber cut off from the outside air. As manufacturing steps of the semiconductor device, using such chemical reactions, may be mentioned, various ones such as etching, ashing, chemical vapor deposition (CVD), sputtering, ion implantation, evaporation, vacuum bake, SEM measurement, etc. There may be a case in which gaseous and liquid toxic substances are used in chemical reaction. The transfer of chemical reactants is carefully carried out.

A semiconductor manufacturing apparatus for manufacturing the semiconductor device under the above-described presumption has routes for transferring liquid and gaseous substances, which exist therein in large numbers. For instance, a CVD system will be considered by way of example. In the CVD system, several types of reaction gases which actually produce reaction by CVD, and several types of carrier gases for maintaining the environment of reaction are introduced into a reaction chamber. The carrier gases are high in stability in most cases, whereas since the reaction gases cause chemical reactions, they are low in stability and often contain toxic ones. Since the CVD reaction is made at low atmospheric pressure near a vacuum, the gases are exhausted from within the reaction chamber by a vacuum pump. Since the exhausted gases contain the toxic ones and high-reactive ones as described above, there is a need to defuse or detoxify these. Therefore, the gases exhausted from the vacuum pump are discharged through a detoxification device.

Such a CVD system makes use of tubes for the purpose of transferring gases. Upon transfer of the reaction and carrier gases, etc., tubes are used to connect between a gas source such as a cylinder and an apparatus. Since the reaction and carrier gases are not so high in flow rate, tubes each small in diameter and formed of a hard material are often used as the tubes used for transfer.

On the other hand, there is a need to provide tubes larger in diameter than the above tubes between the reaction chamber and the vacuum pump and between the vacuum pump and the detoxification device in order to ensure flow rates used for evacuation. As such tubes, may be mentioned a flexible tube. The flexible tube is made up of a thin metal sheet and has concavo-convex surfaces.

When a device and other hard ones collide with the convex portions of the surface of the flexible tube, the convex portions are deformed and destroyed, so that the degree of vacuum in the reaction chamber is not maintained, thus yielding a leak. A flexible tube of a vacuum system is often used under a large atmospheric pressure difference between atmospheric pressure under normal vacuum and the atmospheric pressure. Thus, such a flexible tube is deformed and broken according to the difference in atmospheric pressure between the inside and outside of the flexible tube. There may be a case in which when the flexible tube is accidentally brought into contact with an electric wiring, a short occurs so that a small hole is formed in the flexible tube.

Since process conditions executed within the reaction chamber become different from process conditions to be originally set where the degree of vacuum in the reaction chamber is not kept, there is a possibility that the optimum process will become unexecutable.

SUMMARY OF THE INVENTION

An object of the present invention may provide a method of manufacturing a semiconductor device, which is capable of executing a process according to the set conditions.

Other objects, novel features and advantages of the present invention are partly described in detail, and the parts thereof will become apparent from their description by those skilled in the art. They can be understood by embodying the present invention. The objects and advantages of the present invention can be realized and achieved by constitutions and combinations pointed out by claims.

In a method of manufacturing a semiconductor device, according to the present invention, a flexible tube connects at least part of a path extending from a reaction chamber to a detoxification device through a vacuum pump. The flexible tube has a tube body made of hard material, the tube body having projected parts and depressed parts and a cover provided over an outer surface of the tube body, the cover being made of elastic material, the cover being in contact with around the projected parts of the tube body and formed over the depressed parts of the tube body so that a vacant space is formed between the tube body and the cover. Then, a semiconductor substrate is disposed within the reaction chamber. The vacuum pump is activated to bring the reaction chamber into a pressure-reduced state. A reaction gas is supplied to the reaction chamber. Finally, the reaction gas causes to react to thereby deposit a reactant on the semiconductor substrate.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will be described with reference to the accompanying drawings. Incidentally, the preferred embodiments described herein will be explained in detail so as to be practicable by those skilled in the art. It can be easily understood that other preferred embodiments to which logical and mechanical or electrical changes are made within the scope not departing from the substance of the invention, exit except for these embodiments. Accordingly, matters to be described below do not limit the scope of the present invention, and the scope of the invention is defined only by the matters described in claims.

Figure 1:
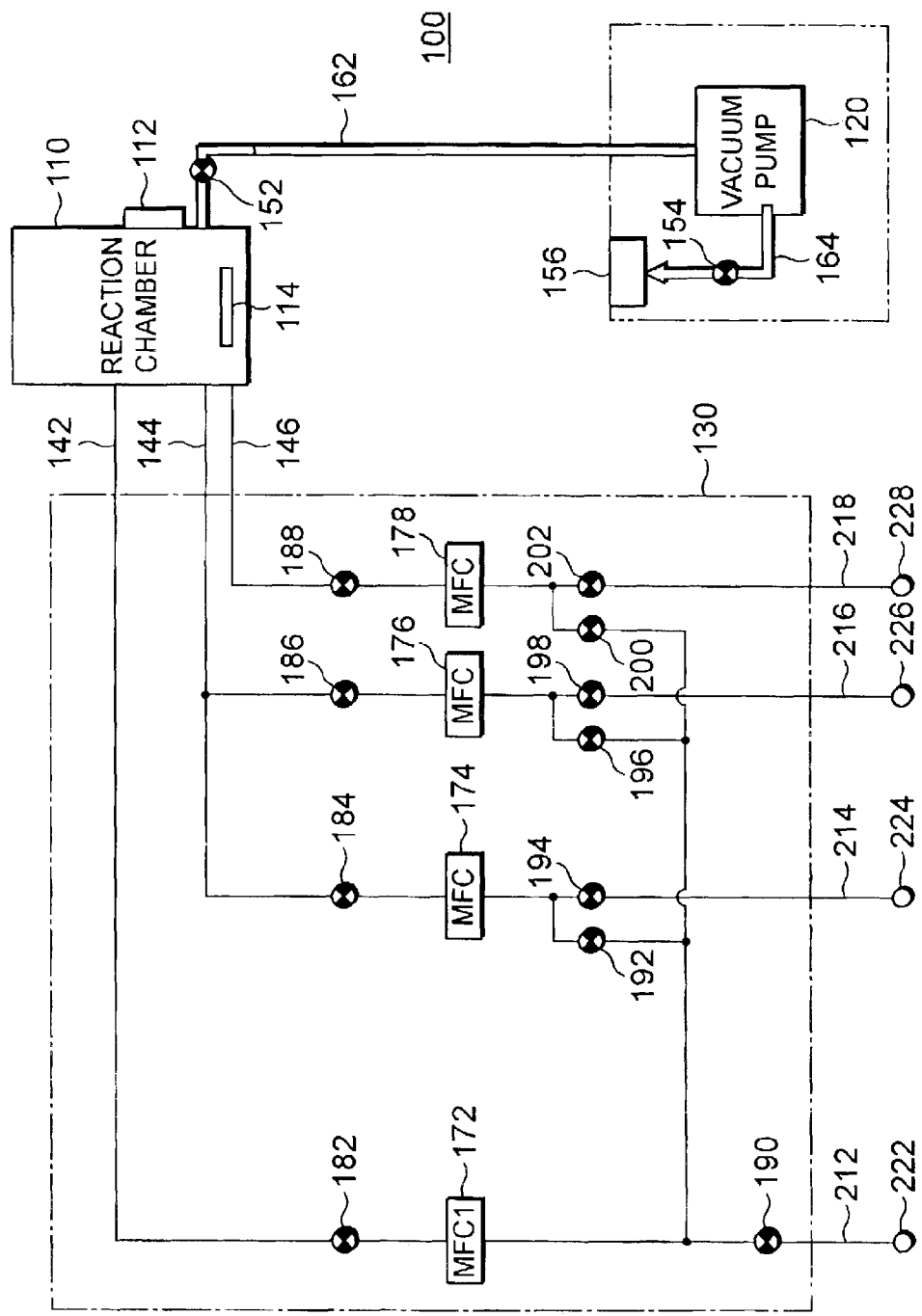
FIG. 1 is a schematic block diagram of a CVD system used in a semiconductor manufacturing method of the present invention.

FIG. 1 is a schematic block diagram of a CVD system used in a semiconductor device manufacturing method of the present invention. Various devices not shown in FIG. 1 additionally exist in an actual CVD system. However, those devices are not described to make clearly understandable the description of the present invention.

The present CVD system 100 comprises a reaction chamber 110 for effecting a CVD process on a semiconductor wafer 114 used as a base material of a semiconductor device, a vacuum pump 120 for bringing the reaction chamber 110 to a depressurized state (hereinafter called vacuum state because it is depressurized in proportion as approximation to vacuum), and a gas flow rate control unit 130 for introducing a reaction gas and a carrier gas into the reaction chamber 110 while adjusting their flow rates. While the vacuum pump 120 is described in the form of a block here, there may also be considered such a case that two or more vacuum pumps are used.

Incidentally, the reaction chamber 110 is provided with a plasma generator 112, which is to produce a plasma reaction. Incidentally, the reaction chamber 110 might be called a "deposition chamber or the like". Incidentally, while the reaction chamber 110 is provided with the plasma generator 112 in the present embodiment, it is needless to say that even a plasma device-free CVD system is capable of implementing the semiconductor device manufacturing method of the present invention.

The gas flow rate control unit 130 and the reaction chamber 110 are connected by tubes 142, 144 and 146. These tubes 142, 144 and 146 are respectively made up of the hard material small in tube diameter as described above. On the other hand, the vacuum pump 120 and the reaction pump 110 are connected by a flexible tube 162 through a valve 152. Incidentally, the vacuum pump 120 is connected to a defusing or detoxification device 156 by a flexible tube 164 through a valve 154 for the purpose of exhaust. Incidentally, the vacuum pump 120 and the detoxification device 156 are provided on another floor of a factory, which is a placed away from the reaction chamber 110.

The gas flow rate control unit 130 is formed integrally with the reaction chamber 110 and has a plurality of mass flow controllers 172 through 178 and a plurality of valves 182 through 202. The gas flow rate control unit 130 is connected to a carrier gas supply source 222 through a tube 212. A carrier gas is fed to the mass flow controllers 172 through 178 through the valves 190, 192, 196 and 200. The carrier gas is flow-controlled by the mass flow controllers 172 through 178 and fed to the reaction chamber 110 through the tubes 142 through 146. Incidentally, the carrier gas is introduced into the reaction chamber 110 via the mass flow controller 172 and the tube 142 when it is introduced therein. On the other hand, other paths are generally used for the following purpose. Namely, the carrier gas is introduced for the purpose of cleaning the mass flow controllers 174 through 178 and tubes 144 and 146 rather than introducing into the reaction chamber. Incidentally, Ar, He, $N_2$, etc. are generally used as the carrier gases.

On the other hand, reaction gas supply sources 224 through 228 are respectively connected to the gas flow rate control unit 130 through tubes 214 through 218. Various gases exist according to the type of film deposited in a CVD process as reaction gases. $SiH_4$, $ClF_3$, TEOS, $SiH_2Cl_2$, $NH_3$, etc. are normally used as the reaction gases.

The CVD process using the CVD system 100 will next be explained.

The above-described CVD system is first prepared. An important point herein resides in that the flexible tubes 162 and 164 respectively connect between the reaction chamber 110 and the vacuum pump 120 and between the vacuum pump 120 and the detoxification device 156. Next, the reaction chamber 110 is brought to the vacuum state by the vacuum pump 120 while the carrier gas is being introduced into the reaction chamber 110 from the carrier gas supply source 222 through the gas flow rate control unit 130. On the other hand, plasma is generated in the reaction chamber 110 by the plasma generator 112. Reaction gases are introduced into the reaction chamber from the reaction gas supply sources 224 through 228 through the gas flow rate control unit 130. Thus, the reaction gases react chemically with the plasma within the reaction chamber 110. A material produced by the chemical reaction is deposited on the semiconductor wafer 114 introduced into the reaction chamber, so that a CVD film is produced or formed on the semiconductor wafer 114.

Figure 2:
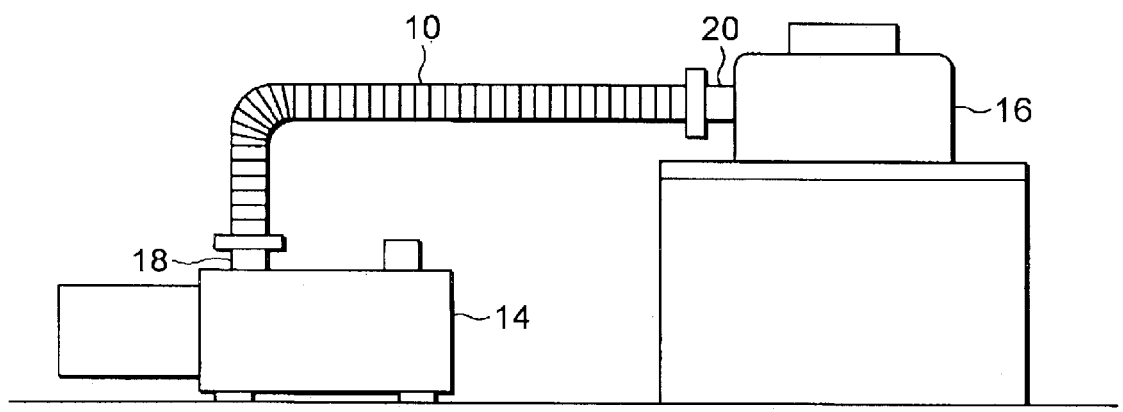
FIG. 2 is a schematic diagram showing part of the CVD system shown in FIG. 1, using a flexible tube.

The flexible tube used in the present invention will now be described. FIG. 2 is a schematic diagram showing part of the CVD system 100 using the flexible tube used in the present invention. FIG. 1 discloses a flexible tube 10, a vacuum pump 14 for effecting evacuation, and a vacuum chamber 16 for maintaining a vacuum state. The flexible tube 10 is provided between the vacuum pump 14 and the vacuum chamber 16. Both ends of the flexible tube 10 are fixed to connecting ports 18 and 20.

Figure 3A:
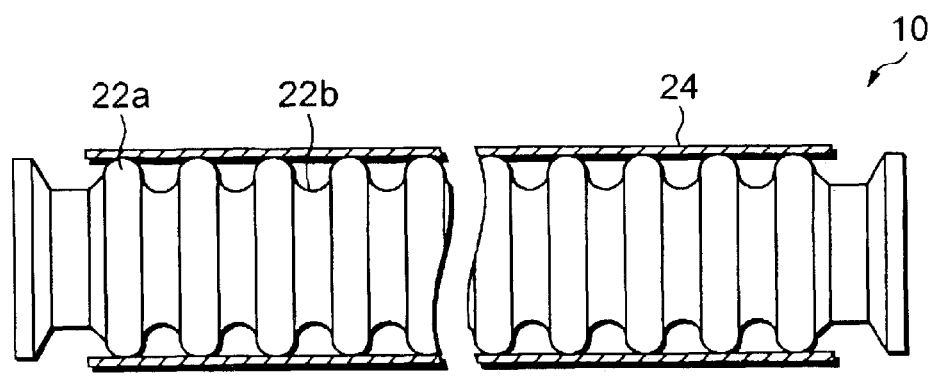
FIG. 3(A) is a cross-sectional view illustrating a structure of the flexible tube shown in FIG. 2.
Figure 3B:
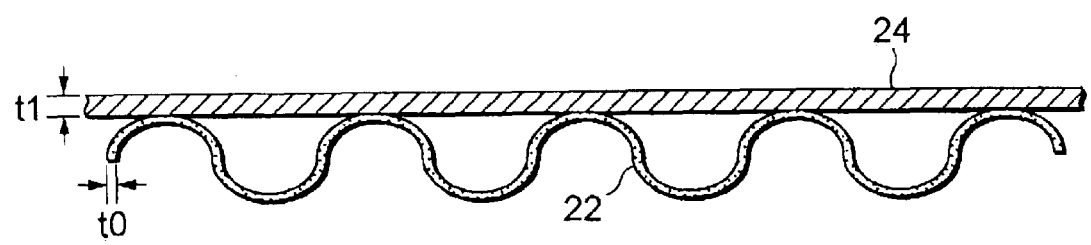
FIG. 3(B) is a partly enlarged cross-sectional view of the flexible tube shown in FIG. 3(A)
Figure 4:
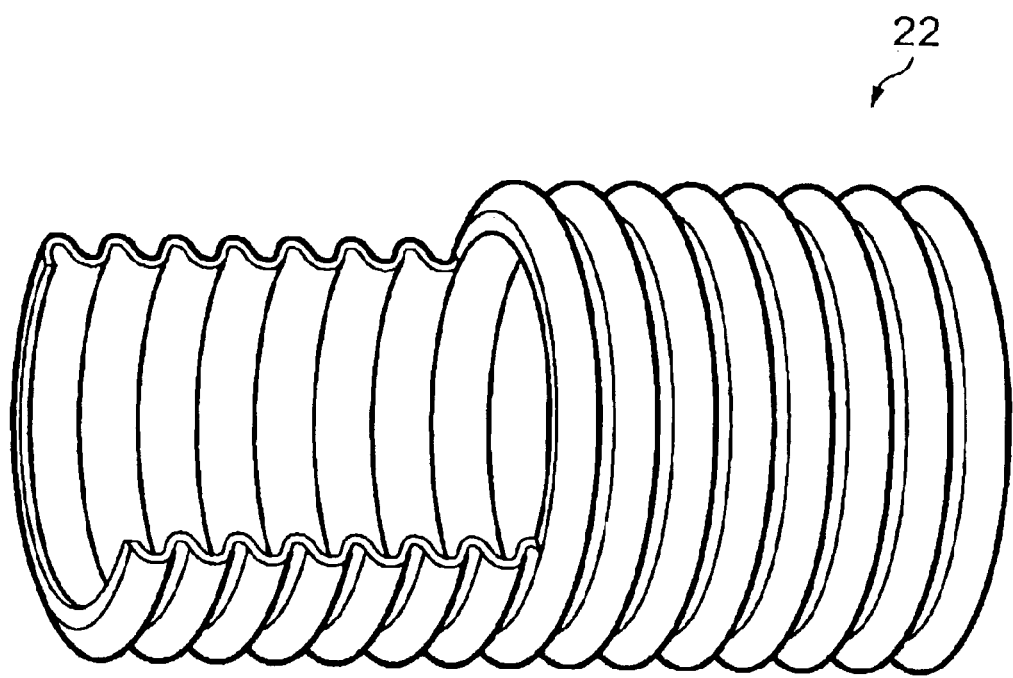
FIG. 4 is a partly cutaway cross-sectional view of a tube body.

FIG. 3(A) is a cross-sectional view showing a structure of the flexible tube 10 described above. FIG. 3(B) is a partly enlarged cross-sectional view of the flexible tube 10 shown in FIG. 3(A). FIG. 4 is a partly cutaway sectional perspective view of a tube body 22.

The flexible tube 10 has the tube body 22 made up of a thin metal sheet such as a stainless metal material or the like, and an elastic cover 24. FIG. 3 is a partly cutaway cross-sectional view of the tube body 22 used in the present invention. The tube body has convex portions 22a and concave portions 22b to obtain flexibility. The elastic cover 24 is provided on the external surface of the tube body 22. The elastic cover 24 is formed of an elastic material like, for example, a silicon resin. The elastic cover 24 has a thickness t1 ranging from about 1 mm to about 2 mm although depending on the diameter of the flexible tube. The thickness t0 of the tube body 22 ranges from about 0.15 mm to about 0.3 mm.

In a manufacturing process, the tube body 22 is simply inserted into the elastic cover 24. The elastic cover 24 is shaped in the form of a cylinder and has an internal surface which contacts the convex portions 22a of the tube body 22 but does not contact the concave portions 22b.

Even when apparatuses or devices and other hard ones collide with the flexible tube 10, the flexible tube 10 is not simply deformed or destroyed. The flexible tube 10 is not simply deformed or destroyed even by the difference in atmospheric pressure between the inside and outside of the flexible tube 10. Further, even when the flexible tube 10 is accidentally brought into contact with an electric wiring, no short occurs because the tube body 22 is covered with the elastic cover 24 having an insulative property.

Figure 5A:
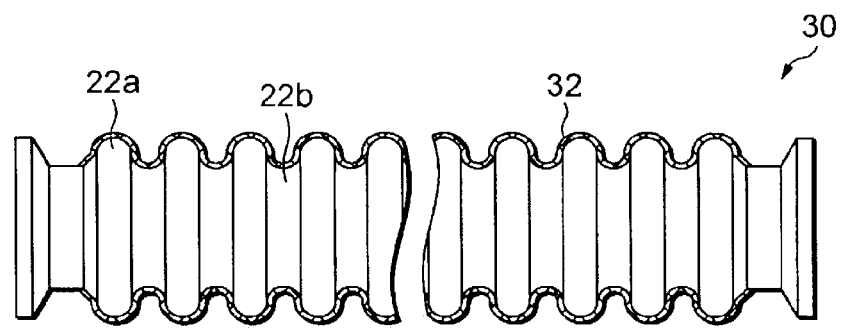
FIG. 5(A) is a cross-sectional view showing another structure of the flexible tube shown in FIG. 2.
Figure 5B:
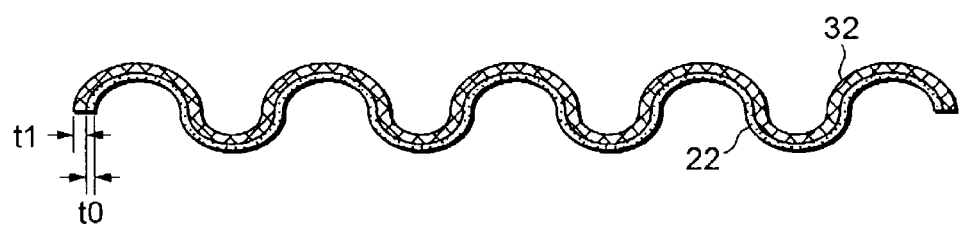
FIG. 5(B) is a partly enlarged cross-sectional view of the flexible tube shown in FIG. 5(A)
Figure 5C:
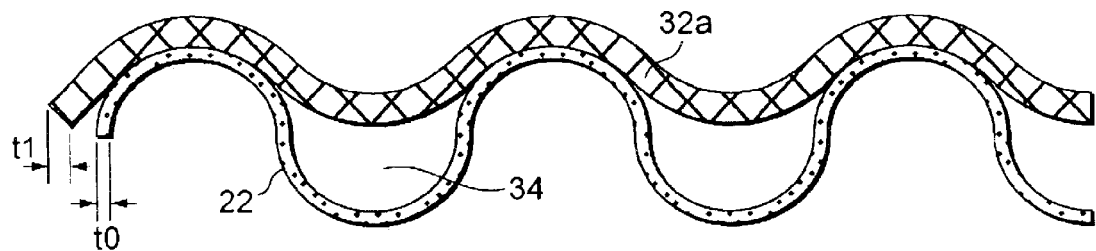
FIG. 5(C) is a cross-sectional view showing a structure of a modification of the flexible tube shown in FIG. 5(B)

FIG. 5(A) is a cross-sectional view showing a structure of another flexible tube 30 available for the CVD system 100. FIG. 5(B) is a partly enlarged cross-sectional view of the flexible tube 30 shown in FIG. 5(A). FIG. 5(C) is a cross-sectional view showing a structure of a modification of the flexible tube shown in FIG. 5(B).

The flexible tube 30 is used in a manner similar to the flexible tube 10. Thus, in the flexible tube 30, the same portions as those in the flexible tube 10 are respectively identified by the same reference numerals and their description will be omitted.

In FIGS. 5(A) and 5(B), the flexible tube 30 has a tube body 22 made up of a thin metal sheet such as a stainless metal material or the like, and an elastic cover 32. The elastic cover 32 is formed so as to contact the entirety of an external surface including convex portions 22a and concave portions 22b of the tube body 22. The elastic cover 32 is formed of an elastic material having a heat shrinkage property, like a silicon resin.

Even in FIG. 5(C), the flexible tube has a tube body 22 made up of a thin metal sheet such as a stainless metal material or the like. In FIG. 5(C), an elastic cover 32a is brought into contact with the tube body 22 in the neighborhood of each concave portion of the tube body 22. However, the elastic cover 32a is not in contact with the tube body 22, and gaps 34 are defined between the two. The elastic cover 24 has a thickness t1 ranging from about 1 mm to about 2 mm although depending on the diameter of the flexible tube. The thickness t0 of the tube body 22 ranges from about 0.15 mm to about 0.3 mm.

In a manufacturing process, a cylinder-shaped elastic cover 32 having an inside diameter larger than an outside diameter of the tube body is prepared. Next, the tube body 22 is inserted into the elastic cover 32. Thereafter, the elastic cover 32 is uniformly heat-treated and then contracted to thereby contact the entirety of the external surface of the tube body 22. Incidentally, such a structure that the elastic cover 32 is brought into contact with the entirety of the external surface of the tube body 22, might not be obtained even by heat contraction. One having such a structure corresponds to the flexible tube shown in FIG. 5(C).

Even when devices and other hard ones collide with the flexible tube 30, the flexible tube 30 is not simply deformed or destroyed. The flexible tube 30 is not simply deformed or destroyed even by the difference in atmospheric pressure between the inside and outside of the flexible tube 30. Further, even when the flexible tube 30 is accidentally brought into contact with an electric wiring, no short occurs because the tube body 22 is covered with the elastic cover 32 having an insulative property.

Figure 6A:
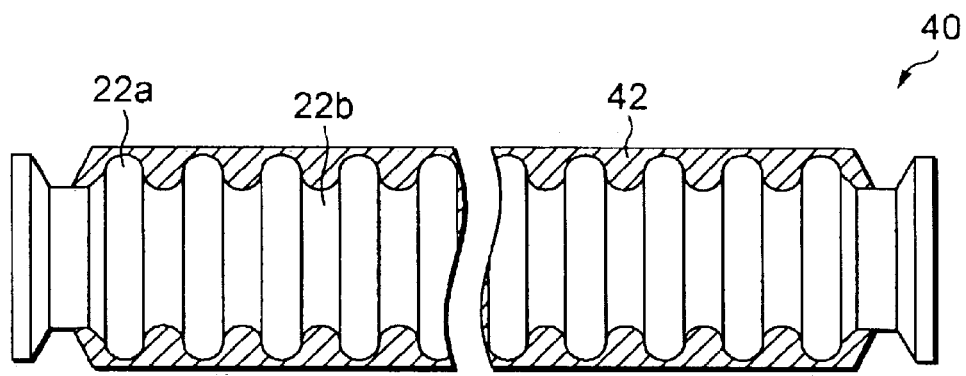
FIG. 6(A) is a cross-sectional view illustrating a further structure of the flexible tube shown in FIG. 2.
Figure 6B:
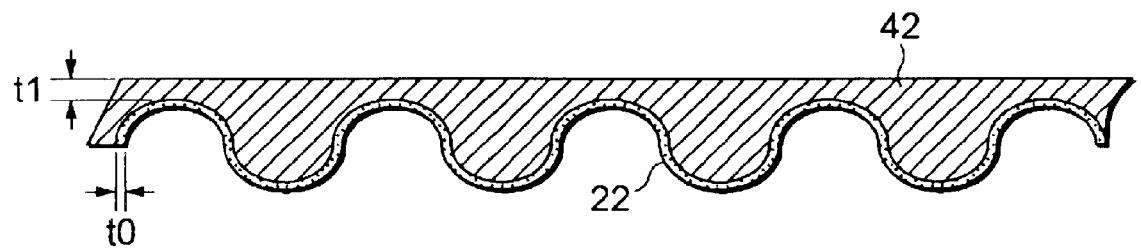
FIG. 6(B) is a partly enlarged cross-sectional view of the flexible tube shown in FIG. 6(A)

FIG. 6(A) is a cross-sectional view showing a structure of a further flexible tube 40 available for the CVD system 100. FIG. 6(B) is a partly enlarged cross-sectional view of the flexible tube 40 shown in FIG. 6(A).

The flexible tube 40 is used in a manner similar to the flexible tube 10. In the description of the flexible tube 40, the same portions as those in the flexible tubes 10 and 30 are respectively identified by the same reference numerals and their description will be omitted.

The flexible tube 40 has a tube body 22 made up of a thin metal sheet such as a stainless metal material or the like, and an elastic cover 42. The elastic cover 42 is formed so as to contact the entirety of an external surface including convex portions 22a and concave portions 22b of the tube body 22. The elastic cover 42 is formed of an elastic material like rubber. The elastic cover 42 has a thickness t1 ranging from about 1 mm to about 2 mm although depending on the diameter of the flexible tube. The thickness t0 of the tube body 22 ranges from about 0.15 mm to about 0.3 mm.

In a manufacturing process, molten rubber is charged into the convex portions 22b of the tube body 22 until it perfectly covers the tube body 22.

Even when devices and other hard ones collide with the flexible tube 40, the flexible tube 40 is not simply deformed or destroyed. The flexible tube 40 is not simply deformed or destroyed even by the difference in atmospheric pressure between the inside and outside of the flexible tube 40. Further, even when the flexible tube 40 is accidentally brought into contact with an electric wiring, no short occurs because the tube body 22 is covered with the elastic cover 42 having an insulative property.

Figure 7A:
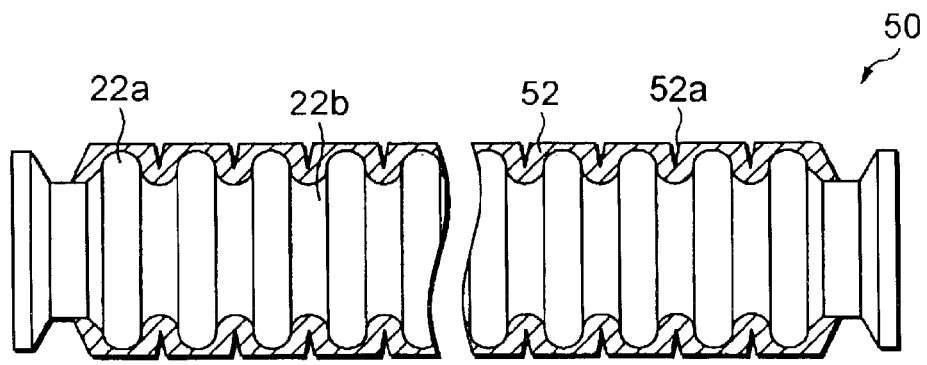
FIG. 7(A) is a cross-sectional view showing a still further structure of the flexible tube shown in FIG. 2.
Figure 7B:
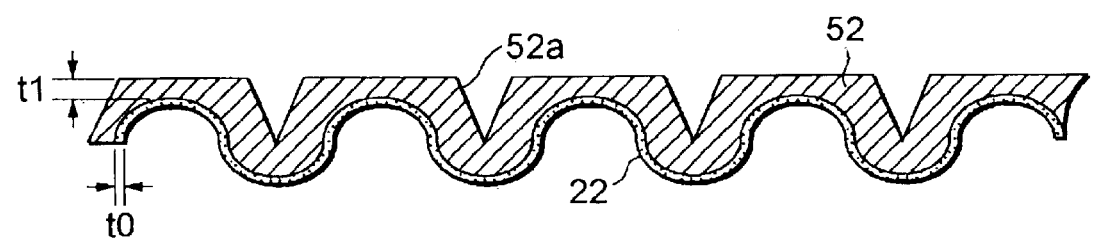
FIG. 7(B) is a partly enlarged cross-sectional view of the flexible tube shown in FIG. 7(A)

FIG. 7(A) is a cross-sectional view showing a structure of a still further flexible tube 50 available for the CVD system 100. FIG. 7(B) is a partly enlarged cross-sectional view of the flexible tube 50 shown in FIG. 7(A).

The flexible tube 50 is used in a manner similar to the flexible tube 10. In the flexible tube 50, the same portions as those in the flexible tubes 30 and 40 are respectively identified by the same reference numerals and their description will be omitted.

The flexible tube 50 has a tube body 22 made up of a thin metal sheet such as a stainless metal material or the like, and an elastic cover 52. The elastic cover 52 is formed so as to contact the entirety of an external surface including convex portions 22a and concave portions 22b of the tube body 22. The elastic cover 52 is formed of an elastic material like rubber. The thickness t0 of the tube body 22 is about 0.3 mm. As shown in FIG. 7(A), the thickness t1 of the elastic cover 52 at each convex portion 22a is about 1 mm. The elastic cover 52 has V-type slits 52a formed at the concave portions 22b of the tube body 22. The V-type slits 52a are respectively formed at such depths that they do not reach the external surface of the tube body 22, in such a way as not to expose the external surface of the tube body 22.

In a manufacturing process, molten rubber is charged into the convex portions 22b of the tube body 22 until it perfectly covers the tube body 22. Thereafter, the V-type slits 52a are formed in the convex portions 22 of the tube body 22.

Even when devices and other hard ones collide with the flexible tube 50, the flexible tube 50 is not simply deformed or destroyed. The flexible tube 50 is not simply deformed or destroyed even by the difference in atmospheric pressure between the inside and outside of the flexible tube 50. Further, even when the flexible tube 50 is accidentally brought into contact with an electric wiring, no short occurs because the tube body 22 is covered with the elastic cover 52 having an insulative property.

Since the elastic cover 52 is additionally formed with the V-type slits 52a, the flexible tube 50 is improved in flexibility as compared with the flexible tube 40. Thus, a bending radius becomes smaller.

Figure 8:
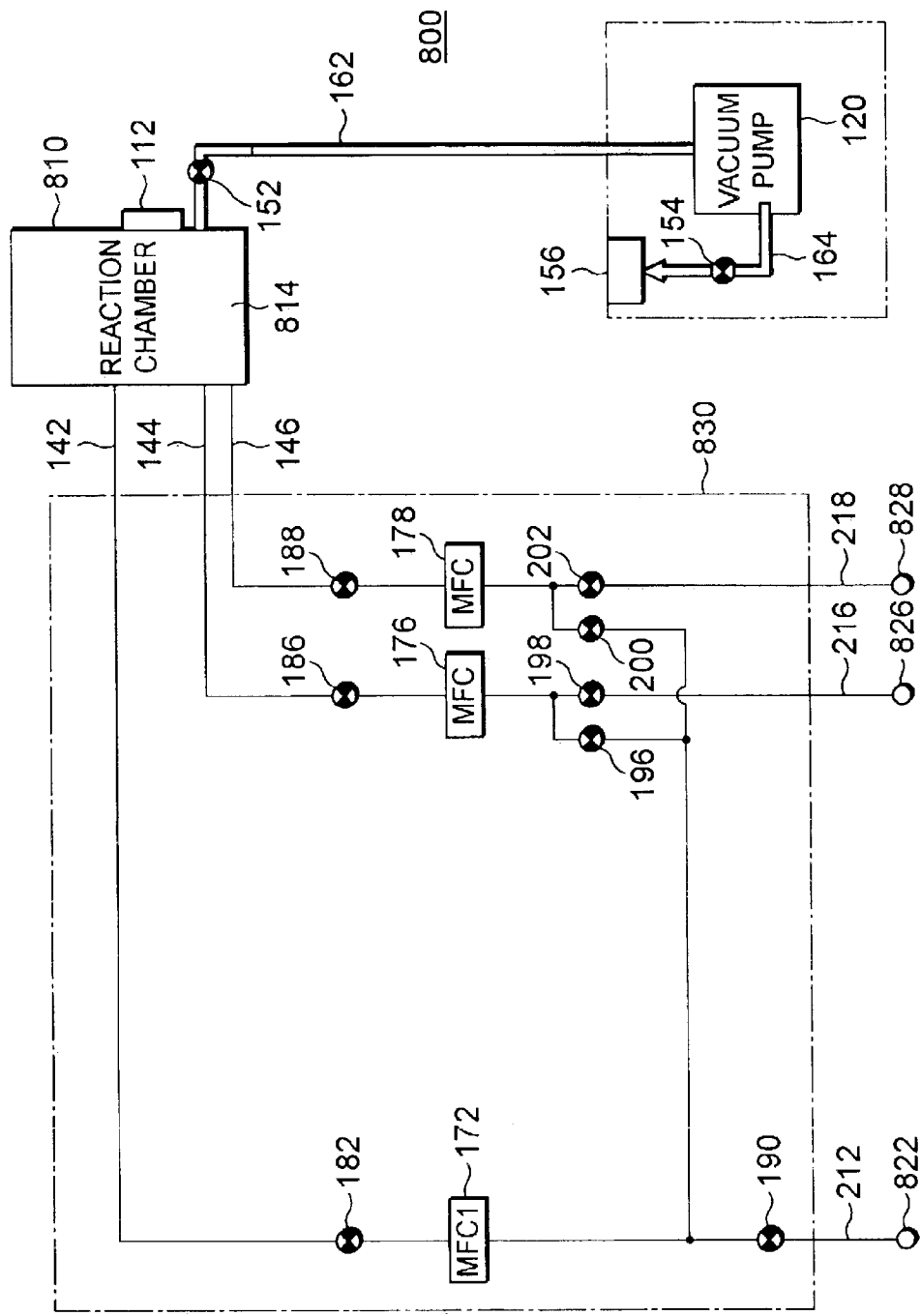
FIG. 8 is a schematic block diagram of an etching system used in a semiconductor manufacturing method of the present invention.

FIG. 8 is a schematic block diagram of an etching system used in a semiconductor device manufacturing method of the present invention. Various devices not shown in FIG. 8 additionally exist in an actual etching system. However, those devices are not described to make it easy to understand the description of the present invention. Incidentally, the same portions as those shown in FIG. 1 are respectively identified by the same reference numerals in FIG. 8, and their description will be omitted.

The present etching system 800 comprises a processing room 810 for effecting an etching process on a semiconductor wafer 814 serving as a base material of a semiconductor device, a vacuum pump 120 for bringing the processing room 810 to a vacuum state, and a gas flow rate control unit 830 for introducing an etching gas and a purge gas into the processing room 810 while adjusting their flow rates. Incidentally, the processing room 810 is provided with a plasma generator 112, which is to produce a plasma reaction. Incidentally, the processing room 810 might be called a "chamber or the like". Incidentally, while the processing room 810 is provided with the plasma generator 112 in the present embodiment, it is needless to say that even a plasma device-free etching system is capable of implementing the semiconductor device manufacturing method of the present invention.

The gas flow rate control unit 830 and the processing room 810 are connected by tubes 142, 144 and 146. The gas flow rate control unit 830 is formed integrally with the processing room 810 and has a plurality of mass flow controllers 172 through 178 and a plurality of valves 182 through 202. The gas flow rate control unit 830 is connected to a purge gas supply source 822 through a tube 212. The purge gas is fed to the mass flow controllers 172 through 178 via valves 190, 196 and 200. The purge gas is flow-controlled by these mass flow controllers 172 through 178 and fed to the processing room 810 through the tubes 142 through 146. Incidentally, the purge gas is introduced via the mass flow controller 172 and the tube 142 when it is introduced into the processing room 810. On the other hand, other paths are generally used for the following purpose. Namely, the purge gas is introduced for the purpose of cleaning the mass flow controllers 174 through 178 and tubes 144 and 146 rather than introducing into the processing room. Incidentally, $N_2$, He, Ar, etc. are generally used as the purge gases. The purge gas also has the function of controlling an etching reaction and improving uniformity.

On the other hand, etching gas supply sources 824 and 828 are respectively connected to the gas flow rate control unit 830 through tubes 216 and 218. Various gases exist according to the type of film removed in an etching process as etching gases. $CHCl_3$, $CCl_4$, $Cl_2$, $CF_4$, $CHF_3$, etc. are normally used as the etching gases. Although not directly involved in etching, gases called an additive gas having the function of controlling an etching reaction and improving uniformity, a control gas, etc. are also introduced into the processing room 810.

The etching process using the etching system 800 will next be explained.

The above-described etching system is first prepared. An important point herein resides in that flexible tubes 162 and 164 respectively connect between the processing room 810 and the vacuum pump 120 and between the vacuum pump 120 and a detoxification device 156. Next, the purge gas is introduced into the processing room 810 from the purge gas supply source 822 through the gas flow rate control unit 830. At this time, the semiconductor wafer 814 has already been placed in a predetermined location in the processing room. Next, the processing room 810 is brought to the vacuum state by the vacuum pump 120. Plasma is generated in the processing room 810 by the plasma generator 112. Etching gases are introduced into the processing room from the etching gas supply sources 826 and 828 through the gas flow rate control unit 830. Thus, the etching gases react chemically with the plasma within the processing room 810. A material formed on the semiconductor wafer 814 by the chemical reaction is removed.

Incidentally, since the details of the flexible tube are the same as ones described above, the description thereof will be omitted.

Figure 9:
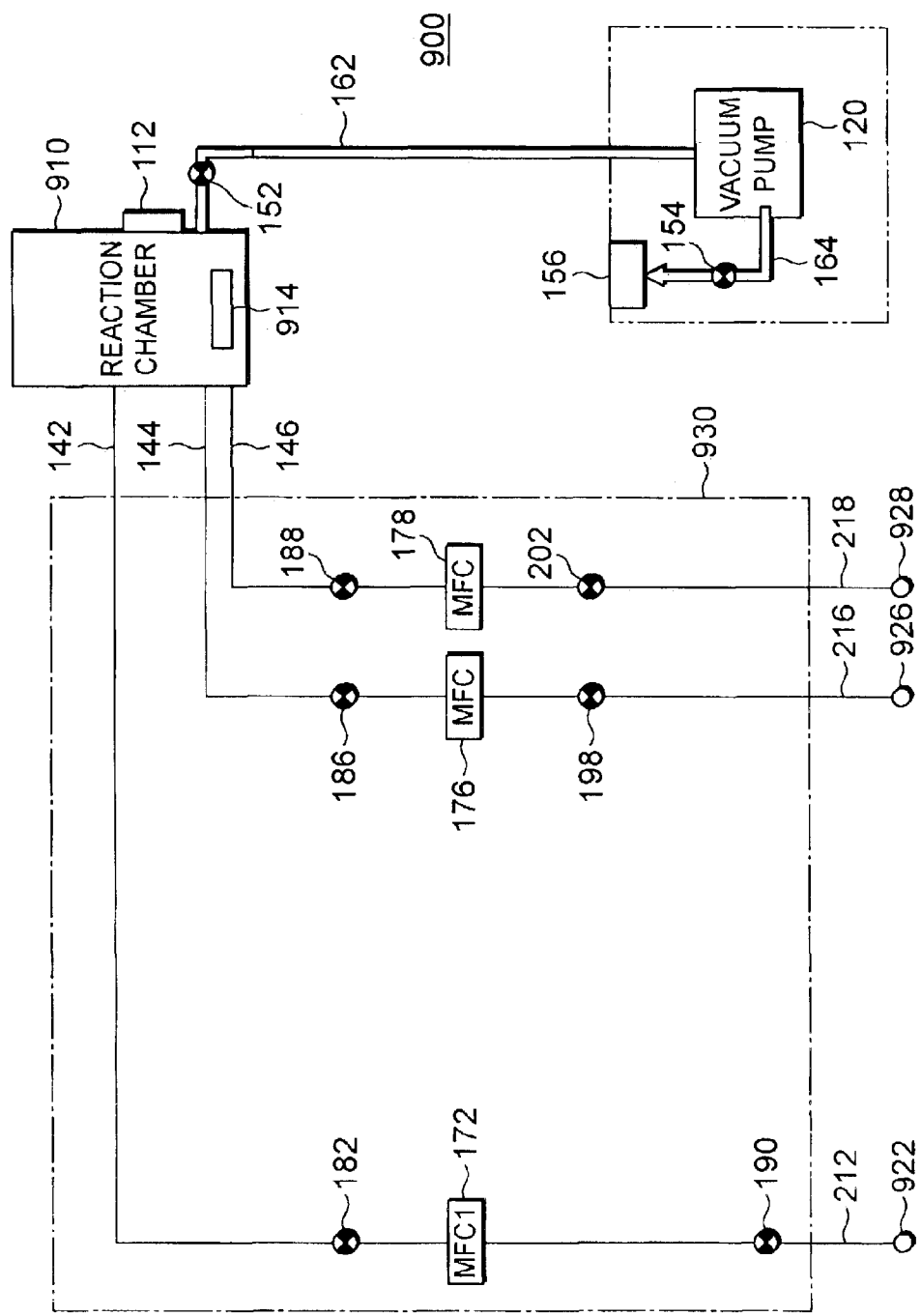
FIG. 9 is a schematic block diagram of an ashing system employed in a semiconductor manufacturing method of the present invention.

FIG. 9 is a schematic block diagram of an ashing system used in a semiconductor device manufacturing method of the present invention. Various devices not shown in FIG. 9 additionally exist in an actual ashing system. However, those devices are not described to make it easy to understand the description of the present invention. The same portions as those shown in FIG. 8 are respectively identified by the same reference numerals in FIG. 9, and their description will be omitted.

The present ashing system 900 comprises a processing room 910 for performing an ashing process for oxidizing a resist or the like formed on a semiconductor wafer 914 serving as a base material of a semiconductor device, a vacuum pump 120 for bringing the processing room 910 to a vacuum state, and a gas flow rate control unit 930 for introducing an oxidation gas and a control gas into the processing room 910 while adjusting their flow rates. Incidentally, the processing room 910 is provided with a plasma generator 112, which is to produce a plasma reaction. Incidentally, the processing room 910 might be called a "chamber or the like". Incidentally, while the processing room 910 is provided with the plasma generator 112 in the present embodiment, it is needless to say that even a plasma device-free ashing system is capable of implementing the semiconductor device manufacturing method of the present invention.

The gas flow rate control unit 930 and the processing room 910 are connected by tubes 142, 144 and 146. The gas flow rate control unit 930 is formed integrally with the processing room 910 and has a plurality of mass flow controllers 172 through 178 and a plurality of valves 182 through 202. The gas flow rate control unit 930 is connected to an oxidation gas supply source 922 through a tube 212. The oxidation gas is fed to the mass flow controller 172 via a valve 190. The oxidation gas is flow-controlled by the mass flow controller 172 and fed to the processing room 910 through the valve 182 and the tube 142. $O_2$ is generally used as the oxidation gas.

On the other hand, control gas supply sources 926 and 928 are respectively connected to the gas flow rate control unit 930 through tubes 216 and 218. The control gas is introduced into the processing room 910 for the purpose of controlling oxidation in an ashing process. $H_2$, He, etc. are generally used as the control gases.

The ashing process using the ashing system 900 will next be explained.

The above-described ashing system is first prepared. An important point herein resides in that flexible tubes 162 and 164 respectively connect between the processing room 910 and the vacuum pump 120 and between the vacuum pump 120 and a detoxification device 156. Next, the oxidation gas is introduced into the processing room 910 from the oxidation gas supply source 922 through the gas flow rate control unit 930. At this time, the semiconductor wafer 914 formed with the resist or the like used as a film subjected to ashing has already been placed in a predetermined location in the processing room 910. Next, the processing room 910 is brought to the vacuum state by the vacuum pump 120. Plasma is generated in the processing room 910 by the plasma generator 112. Control gases are introduced into the processing room 910 from the control gas supply sources 926 and 928 through the gas flow rate control unit 930. Thus, an oxidation reaction accelerated by the plasma occurs within the processing room 910. With the oxidation reaction, the film subjected to ashing, which is formed on the semiconductor wafer 914, is oxidized.

Incidentally, since the details of the flexible tube are the same as ones described above, the description thereof will be omitted.

Figure 10:
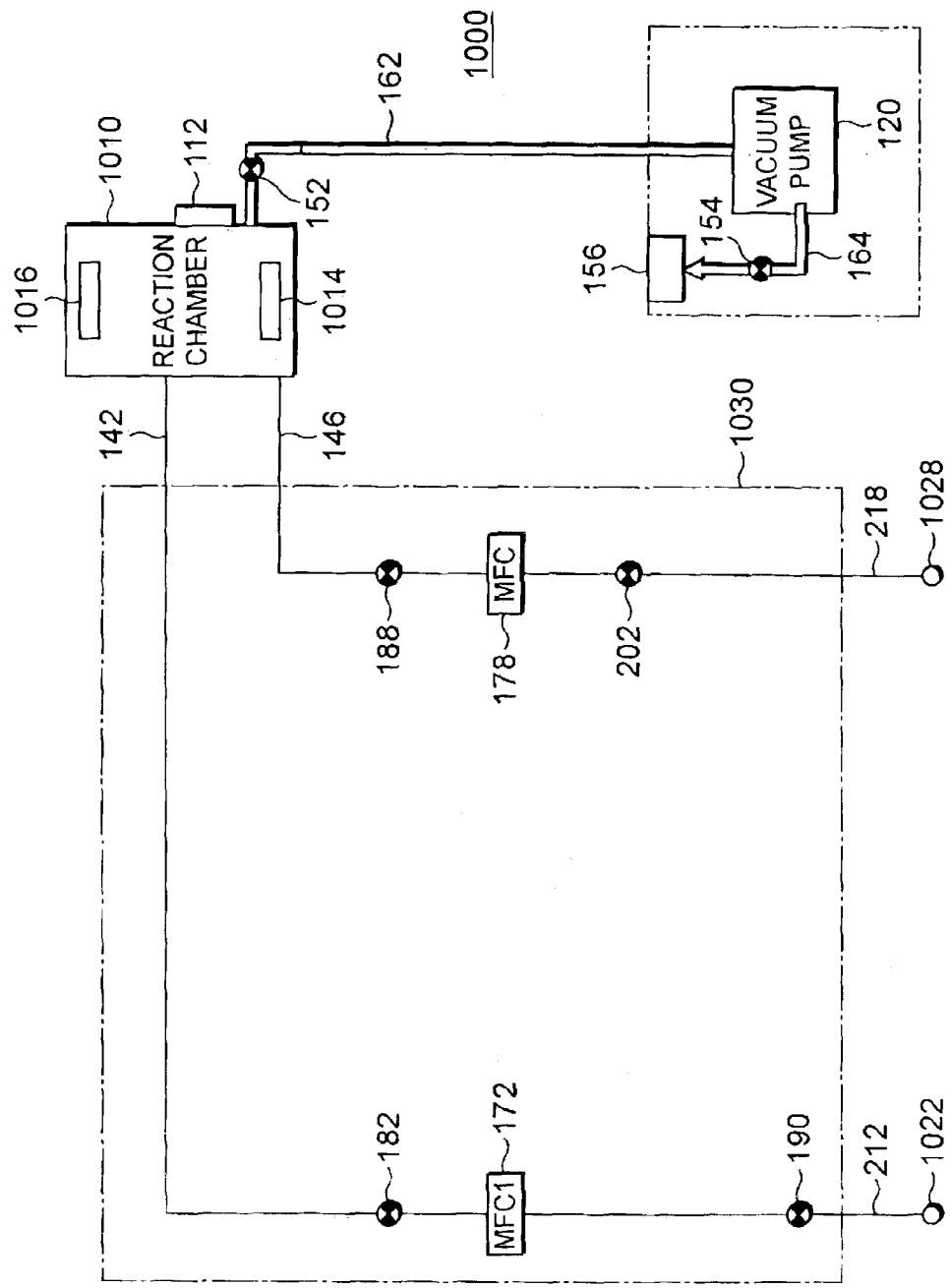
FIG. 10 is a schematic block diagram of a sputtering system used in a semiconductor manufacturing method of the present invention.

FIG. 10 is a schematic block diagram of a sputtering system used in a semiconductor device manufacturing method of the present invention. Various devices not shown in FIG. 10 additionally exist in an actual sputtering system. However, those devices are not described to make it easy to understand the description of the present invention. Incidentally, the same portions as those shown in FIG. 9 are respectively identified by the same reference numerals in FIG. 10, and their description will be omitted.

The present sputtering system 1000 comprises a processing room or chamber 1010 for performing a sputtering process for forming a metal film or the like on a semiconductor wafer 1014 serving as a base material of a semiconductor device, a vacuum pump 120 for bringing the processing chamber 1010 to a vacuum state, and a gas flow rate control unit 1030 for introducing a sputtering gas and a reactive gas into the processing chamber 1010 while adjusting their flow rates. Incidentally, the processing chamber 1010 is provided with a plasma generator 112, which is to produce a plasma reaction.

The gas flow rate control unit 1030 and the processing chamber 1010 are connected by tubes 142 and 146. The gas flow rate control unit 1030 is formed integrally with the processing chamber 1010 and has mass flow controllers 172 and 178 and valves 182, 188, 190 and 202. The gas flow rate control unit 1030 is connected to a sputtering gas supply source 1022 through a tube 212. The sputtering gas is fed to the mass flow controller 172 via the valve 190. The sputtering gas is flow-controlled by the mass flow controller 172 and fed to the processing chamber 1010 through the valve 182 and the tube 142. The sputtering gas serves so as to give energy to a target 1016 disposed within the processing chamber 1010. An inert gas such as Ar, Ne, Xe, He or the like is generally as the sputtering gas.

On the other hand, a reactive gas supply source 1028 is connected to the gas flow rate control unit 1030 through a tube 218. The reactive gas is introduced into the processing chamber 1010 for the purpose of causing reaction with a material for the target in a sputtering process. When it is desired to produce a TiN film by sputtering through the use of a Ti target, for example, an $N_2$ gas is used as the reactive gas. Ti of the target and N of the $N_2$ gas react with each other to form TiN, which in turn is formed on the semiconductor wafer 1014 as a film.

The sputtering process using the sputtering system 1000 will next be explained.

The above-described sputtering system is first prepared. An important point herein resides in that flexible tubes 162 and 164 respectively connect between the processing chamber 1010 and the vacuum pump 120 and between the vacuum pump 120 and a detoxification device 156. Next, the sputtering gas is introduced into the processing chamber 1010 from the sputtering gas supply source 1022 through the gas flow rate control unit 1030. At this time, the semiconductor wafer 1014 has already been placed in a predetermined location in the processing chamber 1010. The processing chamber 1010 is brought to the vacuum state by the vacuum pump 120. Plasma is thereafter generated in the processing chamber 1010 by the plasma generator 112. The reactive gas is introduced into the processing chamber 1010 from the reactive gas supply source 1028 through the gas flow rate control unit 1030 as needed. Thus, molecules of the sputtering gas excited by the plasma collide with the corresponding target within the processing chamber 1010, so that a target material expelled from the target is deposited on the semiconductor wafer 1014. Thus, a film of the target material (or compound of target material and reactive gas) is formed on the semiconductor wafer 1014.

Incidentally, since the details of the flexible tube are the same as ones described above, the description thereof will be omitted.

Figure 11:
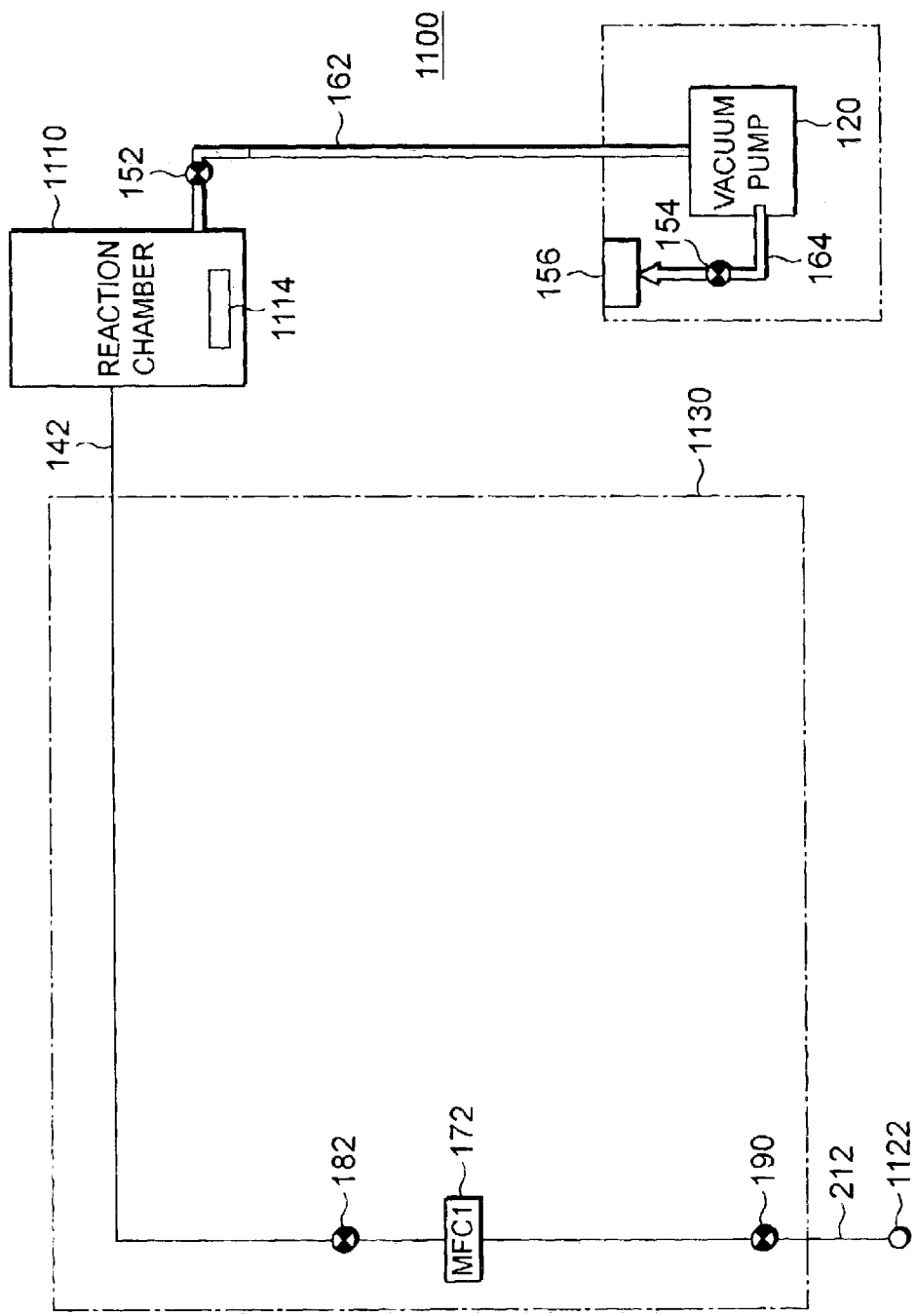
FIG. 11 is a schematic block diagram of a manufacturing apparatus used in a semiconductor manufacturing method of the present invention.

FIG. 11 is a schematic block diagram of a manufacturing system used in a semiconductor device manufacturing method of the present invention. Various devices not shown in FIG. 11 additionally exist in an actual manufacturing system. However, those devices are not described to make it easy to understand the description of the present invention. Incidentally, the same portions as those shown in FIG. 10 are respectively identified by the same reference numerals in FIG. 11, and their description will be omitted.

The present manufacturing system 1100 comprises a processing chamber 1110 for effecting process processing or handling on a semiconductor wafer 1114 serving as a base material of a semiconductor device, a vacuum pump 120 for bringing the processing chamber 1110 to a vacuum state, and a gas flow rate control unit 1130 for introducing a purge gas into the processing chamber 1110 while adjusting its flow rate. Now, the processing chamber 1110 is a generic name for a room where ion implantation and vacuum bake, etc. can be carried out. Individual manufacturing systems 1100 exist every their processes. However, since these individual manufacturing systems can be collectively explained in the manufacturing method of the present invention, the manufacturing system 1100 is typically illustrated for them as shown in FIG. 11.

The gas flow rate control unit 1130 and the processing chamber 1110 are connected by a tube 142. The gas flow rate control unit 1130 is formed integrally with the processing chamber 1110 and has a mass flow controller 172 and valves 182 and 190. The gas flow rate control unit 1130 is connected to a purge gas supply source 1122 through a tube 212. The purge gas is fed to the mass flow controller 172 via the valve 190. The purge gas is flow-controlled by the mass flow controller 172 and fed to the processing chamber 1110 through the valve 182 and the tube 142. The purge gas is introduced to remove unnecessary substances within the processing chamber 1110 in respective processes. An inert gas such as $N_2$, Ar or the like is generally as the purge gas.

A semiconductor device manufacturing method using the present manufacturing system 1100 will next be explained.

The above-described manufacturing system is first prepared. An important point herein resides in that flexible tubes 162 and 164 respectively connect between the processing chamber 1110 and the vacuum pump 120 and between the vacuum pump 120 and a detoxification device 156. Next, the purge gas is introduced into the processing chamber 1110 from the purge gas supply source 1122 through the gas flow rate control unit 1130. At this time, the semiconductor wafer 1114 may already be placed in a predetermined location in the processing chamber 1110. After the processing chamber 1110 is filled with the purge gas, the semiconductor wafer 1114 may be shifted to a predetermined place in the processing chamber 1110. Thereafter, the processing chamber 1110 is brought to the vacuum state by the vacuum pump 120. Subsequently, various process handling or treatments are executed in the processing chamber 1110. When the manufacturing system 1110 is of an ion implantation apparatus, desired ion implantation is effected on the semiconductor wafer 1114. When the manufacturing system 1110 is of a vacuum bake apparatus, the semiconductor wafer 1114 is heat-treated while being held in the vacuum state.

Incidentally, since the details of the flexible tube are the same as ones described above, the description thereof will be omitted.

Figure 12:
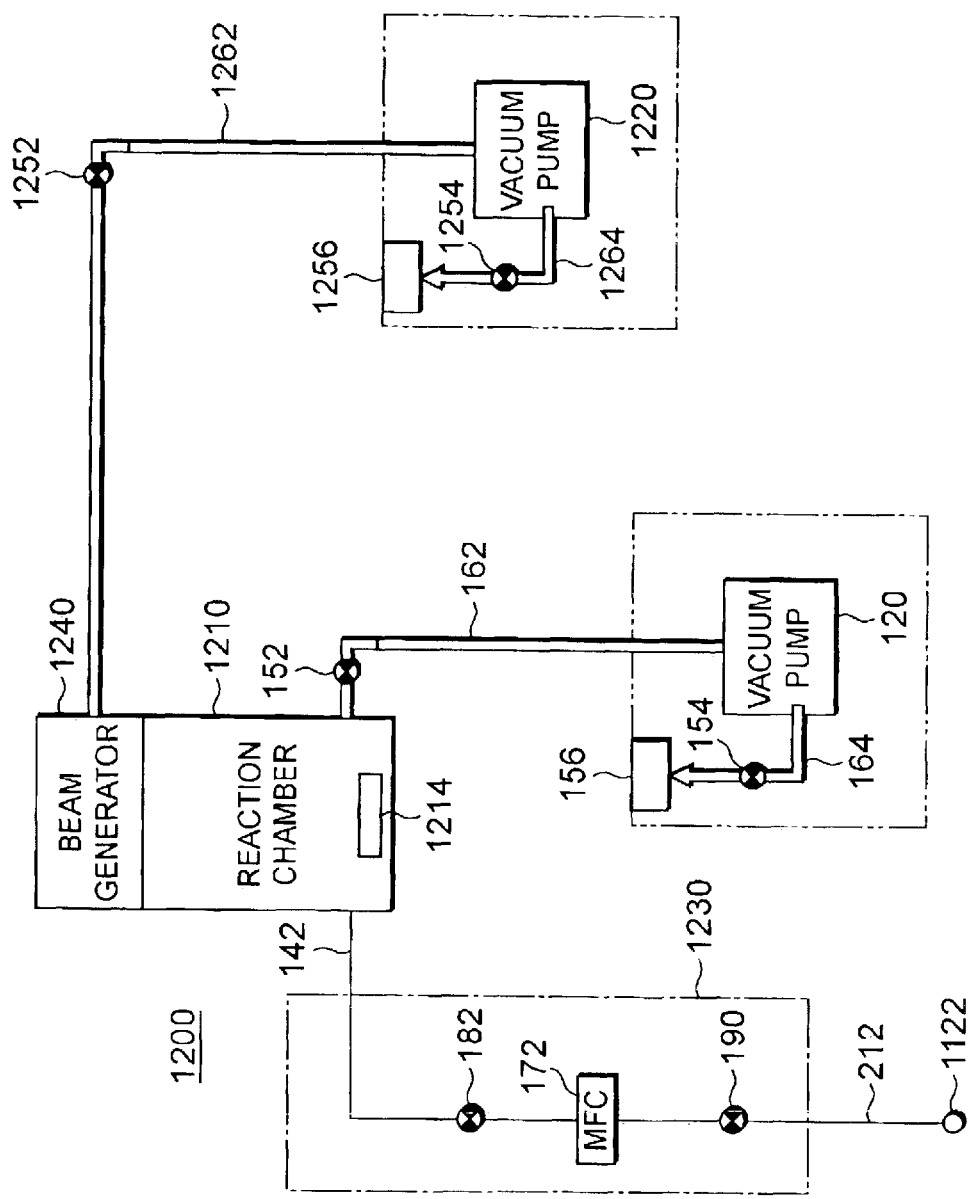
FIG. 12 is a schematic block diagram of a processing system with a beam generation source, which is used in a semiconductor manufacturing method of the present invention.

FIG. 12 is a schematic block diagram of a processing system with a beam generation source, which is used in a semiconductor device manufacturing method of the present invention. Various devices not shown in FIG. 12 additionally exist in an actual processing system with a beam generation source. However, those additional devices are not described to make it easy to understand the description of the present invention. Incidentally, the same portions as those shown in FIG. 11 are respectively identified by the same reference numerals in FIG. 12, and their description will be omitted.

The present processing system 1200 with the beam generation source comprises a processing room or chamber 1210 for effecting predetermined process processing or handling on a semiconductor wafer 1214 serving as a base material of a semiconductor device or observing/measuring the semiconductor wafer, a vacuum pump 120 for bringing the processing chamber 1210 to a vacuum state, and a gas flow rate control unit 1230 for introducing a purge gas into the processing chamber 1210 while adjusting its flow rate. Further, the processing system 1200 has a beam generation source 1240 for applying a predetermined beam to the processing chamber 1210, and a vacuum pump 1220 for bringing the beam generation source 1240 to a vacuum state. Now, the processing chamber 1210 is a generic name for a room where EB (Electron Beam) evaporation, laser anneal, laser dope, a rapid thermal process (RTP), a scanning electron microscope (SEM) measurement, a fluorescent X-ray measurement, etc. can be carried out. Individual processing systems 1200 each having a beam generation source exist every their processes/measurements. However, since these individual processing systems can be collectively explained in the manufacturing method of the present invention, the processing system 1200 with the beam generation source is typically illustrated for them as shown in FIG. 12.

The gas flow rate control unit 1230 and the processing chamber 1210 are connected by a tube 142. The gas flow rate control unit 1230 is formed integrally with the processing chamber 1210 and has a mass flow controller 172 and valves 182 and 190. The gas flow rate control unit 1230 is connected to a purge gas supply source 1222 through a tube 212. The purge gas is fed to the mass flow controller 172 via the valve 190. The purge gas is flow-controlled by the mass flow controller 172 and fed to the processing chamber 1210 through the valve 182 and the tube 142. The purge gas is introduced to remove substances unnecessary for their processes/measurements within the processing chamber 1210. An inert gas such as $N_2$, Ar or the like is generally as the purge gas.

On the other hand, the vacuum pump 1220 and the beam generation source 1240 are connected by a flexible tube 1262 through a valve 1252. Incidentally, the vacuum pump 1220 is connected to a defusing or detoxification device 1256 by a flexible tube 1264 through a valve 1254 for the purpose of exhaust. Incidentally, the vacuum pump 1220 and the detoxification device 1256 are provided on another floor of a factory, which is a placed away from the beam generation source 1240.

A semiconductor device manufacturing method using the processing system 1200 with the beam generation source will next be described.

The above-described processing system with the beam generation source is first prepared. An important point herein resides in that flexible tubes 162 and 164 respectively connect between the processing chamber 1210 and the vacuum pump 120 and between the vacuum pump 120 and a detoxification device 156, and flexible tubes 1262 and 1264 respectively connect between the beam generation source 1240 and the vacuum pump 1220 and between the vacuum pump 1220 and the detoxification device 1256. Next, the beam generation source 1240 is brought to a vacuum state by the vacuum pump 1220. This processing is required to achieve stability of a beam applied from the beam generation source 1240 to the processing chamber 1210. Further, the purge gas is introduced into the processing chamber 1210 from the purge gas supply source 1222 through the gas flow rate control unit 1230. At this time, the semiconductor wafer 1214 may already be placed in a predetermined location in the processing chamber 1210. After the processing chamber 1210 is filled with the purge gas, the semiconductor wafer 1214 may be shifted to a predetermined place in the processing chamber 1210. Thereafter, the processing chamber 1210 is brought to the vacuum state by the vacuum pump 120. Subsequently, various process handling/measurements are executed in the processing chamber 1210.

When the processing system 1210 is of an EB evaporating apparatus, an electron beam is applied from the beam generation source 1240 to the processing chamber 1210 so that metals such as Au, Ag, etc. are evaporated onto the semiconductor wafer 1214 by EB. When the processing system 1210 is of a laser anneal/laser dope apparatus, a laser beam is applied to the processing chamber 1210 from the beam generation source 1240 so that the semiconductor wafer 1214 is heat-treated and impurities are diffused into the semiconductor wafer 1214. When the processing system 1210 is of a rapid thermal process apparatus, the beam generation source 1240 serves as a halogen lamp such as an Xe lamp, and the semiconductor wafer 1214 is subjected to rapid processes such as heating, oxidation, nitriding, etc. When the processing system 1210 is of an SEM measuring apparatus, an electron beam is applied from the beam generation source 1240 to the processing chamber 1210 in the form of scanning. With its application, a secondary electron beam emitted from the semiconductor wafer 1214 is luminance-modulated to thereby enable a measurement of a scanned portion. When the processing system 1210 is of a fluorescent X-ray measuring apparatus, X rays are applied from the beam generation source 1240 to the processing chamber 1210, so that the waveforms and intensities of specific X rays inherent in elements contained in a material on the semiconductor wafer 1214 can be measured.

Incidentally, since the details of each flexible tube are the same as ones described above, the description thereof will be omitted.

According to the semiconductor device manufacturing method of the present invention as described above in detail, flexible tubes are used which are resistant to external mechanical impact and hard to produce deformation and breakdown even by the difference in atmospheric pressure between the inside and outside. It is therefore possible to provide a semiconductor device manufacturing method capable of executing processes according to the set conditions.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device comprising:
    connecting at least part of a path extending from a reaction chamber to a detoxification device through a vacuum pump by a flexible tube having a tube body made of hard material, the tube body having projected parts and depressed parts and a cover provided over an outer surface of the tube body, the cover being made of elastic material, the cover being in contact with around the projected parts of the tube body and formed over the depressed parts of the tube body so that a vacant space is formed between the tube body and the cover, wherein the cover is made of a material selected from the group consisting of heat shrinkable silicone rubber and electron beam bridging soft flame resistance polyolefin resin;
    disposing a semiconductor substrate within the reaction chamber;
    activating the vacuum pump to bring the reaction chamber into a pressure reduced state;
    supplying a reaction gas to the reaction chamber; and
    causing the reaction gas to react to thereby deposit a reactant on the semiconductor substrate.

2. A method of manufacturing a semiconductor device according to claim 1, wherein a thickness of the tube body is about 1–2 mm and a thickness of the cover is about 0.15–0.3 mm.

3. A method of manufacturing a semiconductor device according to claim 1, wherein the cover is made of heat shrinkable silicone rubber.

4. A method of manufacturing a semiconductor device according to claim 1, wherein the cover is made of electron beam bridging soft flame resistance polyolefin resin.

5. A method of manufacturing a semiconductor device according to claim 1, wherein the cover is cylindrically shaped to have an inner surface which is in contact with the projected parts of the tube body but not with the depressed parts.

6. A method of manufacturing a semiconductor device according to claim 1, wherein the cover is formed by:
    providing the cover in a cylindrical shape;
    inserting the tube body into the cover; and
    heating the cover in order to shrink the cover and to be in contact with a part of the outer surface of the tube body.

7. A method of manufacturing a semiconductor device comprising:
    connecting at least part of a path extending from a processing chamber to a detoxification device through a vacuum pump by a flexible tube having a tube body made of hard material, the tube body having projected parts and depressed parts and a cover provided over an outer surface of the tube body, the cover being made of elastic material, the cover being in contact with around the projected parts of the tube body and formed over the depressed parts of the tube body so that a vacant space is formed between the tube body and the cover;
    disposing a semiconductor substrate within the processing chamber;
    activating the vacuum pump to bring the processing chamber into a pressure-reduced state;
    supplying a processing gas to the processing chamber; and
    causing the processing gas to react with a substance on the semiconductor substrate to thereby effect a process on the semiconductor substrate.

8. A method of manufacturing a semiconductor device according to claim 7, wherein the process effected on the semiconductor substrate is an etching process.

9. A method of manufacturing a semiconductor device according to claim 7, wherein the process effected on the semiconductor substrate is an ashing process.

10. A method of manufacturing a semiconductor device according to claim 7, wherein a thickness of the tube body is about 1–2 mm and a thickness of the cover is about 0.15–0.3 mm.

11. A method of manufacturing a semiconductor device according to claim 7, wherein the cover is made of heat shrinkable silicone rubber.

12. A method of manufacturing a semiconductor device according to claim 7, wherein the cover is made of electron beam bridging soft flame resistance polyolefin resin.

13. A method of manufacturing a semiconductor device according to claim 7, wherein the cover is cylindrically shaped to have an inner surface which is in contact with the projected parts of the tube body but not with the depressed parts.

14. A method of manufacturing a semiconductor device according to claim 7, wherein the cover is formed by:
    providing the cover in a cylindrical shape;

inserting the tube body into the cover; and heating the cover in order to shrink the cover and to be in contact with a part of the outer surface of the tube body.

15. A method of manufacturing a semiconductor device comprising:

connecting at least part of a path extending from a processing chamber provided with a target to a detoxification device through a vacuum pump by a flexible tube having a tube body made of hard material, the tube body having projected parts and depressed parts and a cover provided over an outer surface of the tube body, the cover being made of elastic material, the cover being in contact with around the projected parts of the tube body and formed over the depressed parts of the tube body so that a vacant space is formed between the tube body and the cover;

disposing a semiconductor substrate within the processing chamber;

activating the vacuum pump to bring the processing chamber into a pressure-reduced state;

supplying a sputtering gas to the processing chamber; and causing ions of the sputtering gas to collide with the target to thereby deposit a material constituting the target on the semiconductor substrate.

16. A method of manufacturing a semiconductor device according to claim 15, wherein a thickness of the tube body is about 1–2 mm and a thickness of the cover is about 0.15–0.3 mm.

17. A method of manufacturing a semiconductor device according to claim 15, wherein the cover is made of heat shrinkable silicone rubber.

18. A method of manufacturing a semiconductor device according to claim 15, wherein the cover is made of electron beam bridging soft flame resistance polyolefin resin.

19. A method of manufacturing a semiconductor device according to claim 15, wherein the cover is cylindrically shaped to have an inner surface which is in contact with the projected parts of the tube body but not with the depressed parts.

20. A method of manufacturing a semiconductor device according to claim 15, wherein the cover is formed by:

providing the cover in a cylindrical shape;

inserting the tube body into the cover; and heating the cover in order to shrink the cover and to be in contact with a part of the outer surface of the tube body.

21. A method of manufacturing a semiconductor device comprising:

connecting at least part of a path extending from a reaction chamber to a detoxification device through a vacuum pump by a flexible tube having a tube body made of hard material, the tube body having projected parts and depressed parts and a cover provided over an outer surface of the tube body, the cover being made of elastic material, wherein the cover is shaped to be in contact with the surface of the tube body around the projected parts thereof and not to be in contact with the surface of the tube body around at least part of the depressed parts thereof so that a vacant space is formed between the tube body and the cover;

disposing a semiconductor substrate within the reaction chamber;

activating the vacuum pump to bring the reaction chamber into a pressure-reduced state;

supplying a reaction gas to the reaction chamber; and causing the reaction gas to react to thereby deposit a reactant on the semiconductor substrate.

22. A method of manufacturing a semiconductor device according to claim 21, wherein a thickness of the tube body is about 1–2 mm and a thickness of the cover is about 0.15–0.3 mm.

23. A method of manufacturing a semiconductor device according to claim 21, wherein the cover is made of heat shrinkable silicone rubber.

24. A method of manufacturing a semiconductor device according to claim 21, wherein the cover is made of electron beam bridging soft flame resistance polyolefin resin.

25. A method of manufacturing a semiconductor device according to claim 21, wherein the cover is cylindrically shaped to have an inner surface which is in contact with the projected parts of the tube body but not with the depressed parts.

26. A method of manufacturing a semiconductor device according to claim 21, wherein the cover is formed by:

providing the cover with a cylindrical shape;

inserting the tube body into the cover; and heating the cover in order to shrink the cover and to be in contact with a part of the outer surface of the tube body.

27. A method of manufacturing a semiconductor device comprising:

connecting at least part of a path extending from a reaction chamber to a detoxification device through a vacuum pump by a flexible tube having a tube body made of hard material, the tube body having projected parts and depressed parts and a cover provided over an outer surface of the tube body, the cover being made of elastic material and being formed by filling silicon over the whole outer surface of the tube body, wherein the cover is provided with V-shape slits at the depressed parts of the tube body, and wherein the tube body has a thickness of about 1–2 mm and the cover has a thickness of about 0.15–0.3 mm;

disposing a semiconductor substrate within the reaction chamber;

activating the vacuum pump to bring the reaction chamber into a pressure-reduced state;

supplying a reaction gas to the reaction chamber; and causing the reaction gas to react to thereby deposit a reactant on the semiconductor substrate.

28. A method of manufacturing a semiconductor device according to claim 27, wherein the cover is made of heat shrinkable silicone rubber.

29. A method of manufacturing a semiconductor device according to claim 27, wherein the cover is made of electron beam bridging soft flame resistance polyolefin resin.

30. A method of manufacturing a semiconductor device according to claim 27, wherein the V-shape slits do not reach the outer surface of the tube body.

* * * * *